(12) United States Patent
Li et al.

(10) Patent No.: US 9,269,852 B2
(45) Date of Patent: Feb. 23, 2016

(54) SEMICONDUCTOR LIGHT-EMITTING DIODE AND METHOD FOR MANUFACTURING THE SAME

(71) Applicant: HC SEMITEK CORPORATION, Wuhan (CN)

(72) Inventors: Wenbing Li, Wuhan (CN); Jiangbo Wang, Wuhan (CN); Binzhong Dong, Wuhan (CN); Chunyan Yang, Wuhan (CN)

(73) Assignee: HC SEMITEK CORPORATION, Wuhan (CN)

( * ) Notice: Subject to any disclaimer, the term of this patent is extended or adjusted under 35 U.S.C. 154(b) by 0 days.

(21) Appl. No.: 14/479,274

(22) Filed: Sep. 6, 2014

(65) Prior Publication Data

US 2014/0374700 A1    Dec. 25, 2014

Related U.S. Application Data

(63) Continuation-in-part of application No. PCT/CN2012/079285, filed on Jul. 27, 2012.

(30) Foreign Application Priority Data

Mar. 6, 2012 (CN) .......................... 2012 1 0056382

(51) Int. Cl.
*H01L 21/00* (2006.01)
*H01L 33/00* (2010.01)
*H01L 33/14* (2010.01)
*H01L 33/06* (2010.01)
*H01L 33/04* (2010.01)
*H01L 33/32* (2010.01)

(52) U.S. Cl.
CPC ............ *H01L 33/0025* (2013.01); *H01L 33/04* (2013.01); *H01L 33/06* (2013.01); *H01L 33/145* (2013.01); *H01L 33/0075* (2013.01); *H01L 33/32* (2013.01)

(58) Field of Classification Search
CPC ...................................................... H01L 33/06
See application file for complete search history.

(56) References Cited

U.S. PATENT DOCUMENTS

2010/0164365 A1 * 7/2010 Yoshino et al. ............... 313/503
2011/0272667 A1 * 11/2011 Takayama ...................... 257/13

OTHER PUBLICATIONS

CN 101640236 A (Advanced Optoelectronic Tech) Feb. 3, 2010, translation thereof.*

* cited by examiner

*Primary Examiner* — Alexander Ghyka
(74) *Attorney, Agent, or Firm* — Matthias Scholl, PC; Matthias Scholl

(57) ABSTRACT

A semiconductor light-emitting diode, including: an n-GaN layer, a quantum well layer, an electron blocking layer, and a p-GaN layer, which are sequentially stacked on a substrate. The electron blocking layer includes at least one first AlGaN layer and at least one second AlGaN layer. The first AlGaN layer and the second AlGaN layer are alternately stacked. The adjacent first and second AlGaN layers have different Al component.

12 Claims, 6 Drawing Sheets

SEMICONDUCTOR LIGHT-EMITTING DIODE AND METHOD FOR MANUFACTURING THE SAME

CROSS-REFERENCE TO RELATED APPLICATIONS

This application is a continuation-in-part of International Patent Application No. PCT/CN2012/079285 with an international filing date of Jul. 27, 2012, designating the United States, now pending, and further claims priority benefits to Chinese Patent Application No. 201210056382.0 filed Mar. 6, 2012. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18$^{th}$ Floor, Cambridge, Mass. 02142.

BACKGROUND OF THE INVENTION

1. Field of the Invention

The present invention relates to a semiconductor light-emitting diode (LED) and method for manufacturing the same.

2. Description of the Related Art

The leakage of electrons is a main factor affecting the quantum efficiency. To block the leakage of the electron, an electron blocking layer is provided between the quantum well layer and the p-region of the conventional semiconductor LED. The quantum well layer is usually made of a plurality of GaN layers and a plurality of InGaN layers. The electron blocking layer is usually made of AlGaN-series material. Since the AlGaN-series material has a high bandgap, it can form a high conduction band offset with the GaN and InGaN, which can block the overflow of the electrons.

However, the electron blocking layer not only forms a high conduction band offset with the GaN and the InGaN, but also forms a high valence band offset, which tends to block the hole moving from the p-region to the quantum well. That is to say, the conventional electron blocking layer blocks the electron and the hole at the same time. It inhibits the leakage of the electron at the expense of hole injection efficiency. It is difficult to create an efficient hole injection under forward bias, thereby impeding the improvement of the quantum efficiency of the semiconductor LED.

SUMMARY OF THE INVENTION

In view of the above-described problems, it is one objective of the invention to provide a semiconductor LED and a method for manufacturing same, which can solve the problem that the electron blocking layer inhibits the hole in p-region from moving to the quantum well, thereby improving the quantum efficiency of the LED.

To achieve the above objective, in accordance with one embodiment of the invention, there is provided a semiconductor LED comprising an n-GaN layer, a quantum well layer, an electron blocking layer, and a p-GaN layer, which are sequentially stacked on a substrate. The electron blocking layer comprises at least one first AlGaN layer and at least one second AlGaN layer. The first AlGaN layer and the second AlGaN layer are alternately stacked, adjacent first and second AlGaN layers have different Al component.

In a class of this embodiment, the electron blocking layer comprises a plurality of first AlGaN layers and a plurality of second AlGaN layers, the Al component of the plurality of first AlGaN layers is gradually changed layer by layer, and the Al component of the plurality of second AlGaN layers are invariable.

In a class of this embodiment, the first AlGaN layer with lowest Al component is located in the middle portion of the electron blocking layer, from the first AlGaN layer with lowest Al component to the side of the quantum well layer, the Al component of the first AlGaN layers is gradually increased layer by layer; from the first AlGaN layer with lowest Al component to the side of the p-GaN layer, the Al component of the first AlGaN layers is gradually increased layer by layer.

In a class of this embodiment, the Al component of the plurality of second AlGaN layers are invariable, the first AlGaN layer with highest Al component is located in the middle portion of the electron blocking layer, from the first AlGaN layer with highest Al component to the side of the quantum well layer, the Al component of the first AlGaN layers is gradually decreased layer by layer; from the first AlGaN layer with highest Al component to the side of the p-GaN layer, the Al component of the first AlGaN layers is gradually decreased layer by layer.

In a class of this embodiment, the electron blocking layer comprises a plurality of first AlGaN layers and a plurality of second AlGaN layers, the Al component of the plurality of first AlGaN layers is gradually changed layer by layer, and the Al component of the plurality of second AlGaN layers are also gradually changed layer by layer, the changing trend of the Al component of the plurality of first AlGaN layers is the same as that of the plurality of second AlGaN layers.

In a class of this embodiment, the first AlGaN layer with highest Al component is located in the middle portion of the electron blocking layer, from the first AlGaN layer with highest Al component to the side of the quantum well layer, the Al component of the first AlGaN layers is gradually decreased layer by layer; from the first AlGaN layer with highest Al component to the side of the p-GaN layer, the Al component of the first AlGaN layers is gradually decreased layer by layer; the second AlGaN layer with highest Al component is located in the middle portion of the electron blocking layer, from the second AlGaN layer with highest Al component to the side of the quantum well layer, the Al component of the first AlGaN layers is gradually decreased layer by layer; from the second AlGaN layer with highest Al component to the side of the p-GaN layer, the Al component of the first AlGaN layers is gradually decreased layer by layer.

In a class of this embodiment, the first AlGaN layer with lowest Al component is located in the middle portion of the electron blocking layer, from the first AlGaN layer with lowest Al component to the side of the quantum well layer, the Al component of the first AlGaN layers is gradually increased layer by layer; from the first AlGaN layer with lowest Al component to the side of the p-GaN layer, the Al component of the first AlGaN layers is gradually increased layer by layer; the second AlGaN layer with lowest Al component is located in the middle portion of the electron blocking layer, from the second AlGaN layer with lowest Al component to the side of the quantum well layer, the Al component of the first AlGaN layers is gradually increased layer by layer; from the second AlGaN layer with lowest Al component to the side of the p-GaN layer, the Al component of the first AlGaN layers is gradually increased layer by layer.

In a class of this embodiment, the first AlGaN layers and the second AlGaN layers have a total number of between 2 and 40.

In a class of this embodiment, the difference of Al component between adjacent first AlGaN layer and second AlGaN layer is between 0.05 and 0.15.

In a class of this embodiment, the thickness of the electron blocking layer is between 20 and 50 nm, the thickness of each of the first AlGaN layers is between 1 and 3 nm, and the thickness of each of the second AlGaN layers is between 1 and 3 nm.

Specifically, the highest Al component of the first AlGaN layer and the highest Al component of the second AlGaN layer are between 0.15 and 0.5, respectively.

Another aspect of the present invention is to provide a method for manufacturing the abovementioned semiconductor light-emitting diode which comprises sequentially growing an n-GaN layer, a quantum well layer, an electron blocking layer and a p-GaN layer on a substrate.

Advantages according to embodiments of the invention are summarized below. The embodiments of the present invention design and optimize the changes of the Al component of the electron blocking layer by energy band engineering, namely by arranging the first and second AlGaN layers which are alternately stacked and form a structure like a superlattice structure to generate a three-dimensional free hole gas in the p-GaN layer and, in turn, obtain a high hole concentration which can reach an order of $1*e^{18}$ cm$^{-3}$. Then the overflow of the electrons can be blocked, while hole injection efficiency can be improved, thereby improving the quantum efficiency of the LED.

BRIEF DESCRIPTION OF THE DRAWINGS

The invention is described hereinbelow with reference to accompanying drawings, in which.

DETAILED DESCRIPTION OF THE EMBODIMENTS

For further illustrating the invention, experiments detailing a semiconductor LED and preparation method thereof are described below. It should be noted that the following examples are intended to describe and not to limit the invention.

Figure 1:
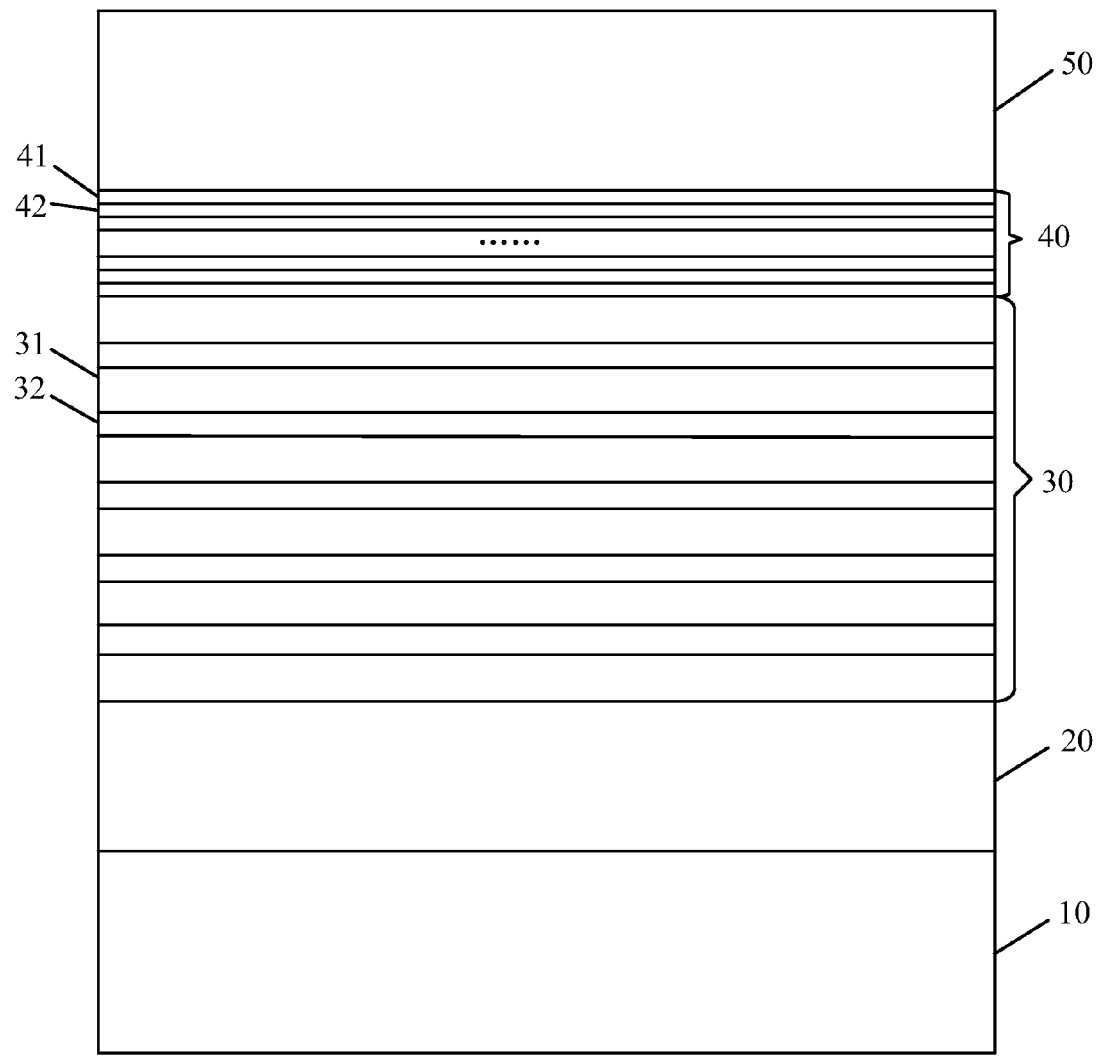
FIG. 1 is a schematic diagram of a semiconductor LED according to embodiments of the invention.

Referring to FIG. 1, an example of the present invention provides a semiconductor LED. The semiconductor LED comprises an n-GaN layer 20, a quantum well layer 30, an electron blocking layer 40, and a p-GaN layer 50, which are sequentially stacked on a substrate 10. The electron blocking layer 40 comprises at least a first AlGaN layer 41 and at least a second AlGaN layer 42, wherein the first AlGaN layer 41 and the second AlGaN layer 42 are alternately stacked. The first AlGaN layer 41 and the second AlGaN layer 42 which are adjacent to each other have different Al component.

Specifically, the first AlGaN layers 41 and the second AlGaN layers 42 have a total number of between 2 and 40.

Preferably, in some examples, the electron blocking layer 4 comprises a plurality of first AlGaN layers 41 and a plurality of second AlGaN layers 42, the Al component of the plurality of first AlGaN layers 41 is gradually changed layer by layer, and the Al component of the plurality of second AlGaN layers 42 are invariable.

Preferably, in another examples, the electron blocking layer 4 comprises a plurality of first AlGaN layers 41 and a plurality of second AlGaN layers 42, the Al component of the plurality of first AlGaN layers 41 is gradually changed layer by layer, and the Al component of the plurality of second AlGaN layers 42 are also gradually changed layer by layer, the changing trend of the Al component of the plurality of first AlGaN layers 41 is the same as that of the plurality of second AlGaN layers 42. For example, from the side of the quantum well layer 30 to the side of the p-GaN layer 50, the Al component of the first AlGaN layers 41 is gradually increased layer by layer, and the Al component of the second AlGaN layers 42 are also gradually increased layer by layer; or the Al component of the first AlGaN layers 41 is gradually decreased layer by layer, while the Al component of the second AlGaN layers 42 are also gradually decreased layer by layer; or the Al component of the first AlGaN layers 41 is first increased and then decreased, while the Al component of the second AlGaN layers 42 is also first increased and then decreased.

The thickness of the electron blocking layer 40 is preferably 20-50 nm, and the thickness of each of the first AlGaN layers 41 and the second AlGaN layers 42 is preferably 1-3 nm.

The highest Al component of the first AlGaN layer and the highest Al component of the second AlGaN layer are between 0.15 and 0.5, respectively.

Preferably, the difference of Al component between adjacent first AlGaN layer and second AlGaN layer is between 0.05 and 0.15.

In a practical application of the present invention, the substrate 10 is preferably a sapphire substrate. The n-GaN layer is doped with an impurity of monatomic silicon with doping concentration of an order of $e^{18}$-$e^{19}$ cm$^{-3}$. The quantum well layer 30 is made up of a plurality of pairs of GaN layer 31 and InGaN layer 32. The GaN layer 31 is a barrier layer and its thickness is preferably 9-12 nm. The InGaN layer 32 is a well layer and its thickness is preferably 2-3 nm. In component of InGaN layer 32 is 0.10-0.30, corresponding to an emission wavelength of 450 nm-550 nm. The first AlGaN layers 41 and the second AlGaN layers 42 are lightly doped p-AlGaN layers. The p-GaN layer is doped with an impurity of Magnesium with a doping concentration of an order of $e^{19}$-$e^{21}$ cm$^{-3}$. The thickness of the p-GaN layer is 100-200 nm.

It should be noted that the semiconductor LED can further comprise a buffer layer located between the substrate 10 and the n-GaN layer 20. The buffer layer is an undoped GaN layer grown at low temperature, which is used to alleviate the lattice mismatch between GaN series epitaxial material and the substrate and reduce the dislocation and defect density. Moreover, the semiconductor LED can further comprise a clad p-GaN layer disposed on the p-GaN layer, a semiconductor contact layer for providing a low resistance in order to produce a good ohmic contact, and so on. These structures are well known to the skilled person, a detailed description is omitted here.

The examples of the present invention design and optimize the changes of the Al component of the electron blocking layer by energy band engineering, namely by arranging the first and second AlGaN layers which are alternately stacked and form a structure like a superlattice structure to generate a three-dimensional free hole gas in the p-GaN layer and, in turn, obtain a high hole concentration which can reach an order of $1*e^{18}$ cm$^{-3}$. Then the overflow of the electrons can be blocked, while hole injection efficiency can be improved, thereby improving the quantum efficiency of the LED.

Example 1

Figure 2:
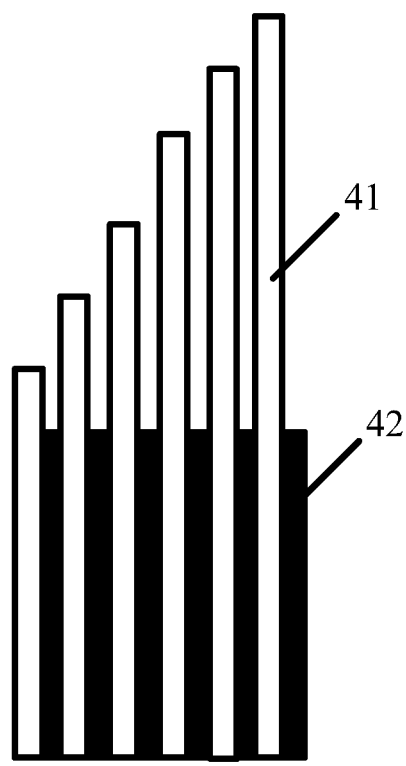
FIG. 2 is a schematic view illustrating the distribution of Al component content in an electron blocking layer in a first embodiment of the invention.

The semiconductor LED in Example 1 has the same structure as the abovementioned example. In this example, the distribution of Al component of the first AlGaN layers and the second AlGaN layers of the electron blocking layer is shown in FIG. 2. In FIG. 2, white boxes represent the first AlGaN layers, black boxes represent the second AlGaN layers, and the height of the boxes indicates the size of the content of the layer of Al components. A left side of the figure denotes the side of the quantum well layer, and a right side of the figure denotes the side of the p-GaN layer.

As shown in FIG. 2, in this example, from the side of the quantum well layer to the side of the p-GaN layer, namely from the left side to the right side, the Al component of the plurality of first AlGaN layers 41 is gradually increased layer by layer, and the Al component of the plurality of second AlGaN layers 42 are invariable.

In this example, the electron blocking layer 40 may comprise, but not limited to, ten first AlGaN layers 41 and ten second AlGaN layers 42. Al component of the second AlGaN layer 42 is 0. Al component of the leftmost first AlGaN layer 41 is 0, Al component of the rightmost first AlGaN layer 41 is 0.2. From left to right, Al component of each first AlGaN layer 41 is increased by an amount of 0.02. It can be envisaged that the Al component of each of the first AlGaN layer 41 is increased by an unfixed amount, as long as they can gradually increase.

The thickness of the electron blocking layer 40 is preferably 20-50 nm, and the thickness of each of the first AlGaN layers 41 and the second AlGaN layers 42 is preferably 1-3 nm.

In this example, the electron blocking layer 40 may have a thickness of 30 nm, and each of the first AlGaN layers 41 and the second AlGaN layers 42 may have a thickness of 1.5 nm.

It should be noted that the number of the first AlGaN layers and the number of the second AlGaN layers in the figure are only examples, but do not represent the actual number of them, which is used to illustrate the change rule of Al component of the first AlGaN layers and the second AlGaN layers. In this example, the number of the first AlGaN layers is the same number as that of the second AlGaN layers, but the number of the first AlGaN layers also can be different from that of the second AlGaN layers. In this example, the thickness of the first AlGaN layer is the same number as that of the second AlGaN layer, but the thickness of the first AlGaN layer also can be different from that of the second AlGaN layer. Moreover, the stacking order of the first AlGaN layers and the second AlGaN layers is not limited by the example. Additionally, Al component of all of the first AlGaN layers are higher than that of all of the second AlGaN layers, but in other examples, Al component of some of the first AlGaN layers are higher than that of the second AlGaN layers, while Al component of other first AlGaN layers are lower than that of the second AlGaN layers; or Al component of all of the first AlGaN layers are lower than that of all of the second AlGaN layers.

The examples of the present invention design and optimize the changes of the Al component of the electron blocking layer by energy band engineering, namely by arranging the first and second AlGaN layers which are alternately stacked and form a structure like a superlattice structure to generate a three-dimensional free hole gas in the p-GaN layer and, in turn, obtain a high hole concentration which can reach an order of $1*e^{18}$ cm$^{-3}$. Then the overflow of the electrons can be blocked, while hole injection efficiency can be improved, thereby improving the quantum efficiency of the LED.

Example 2

Figure 3:
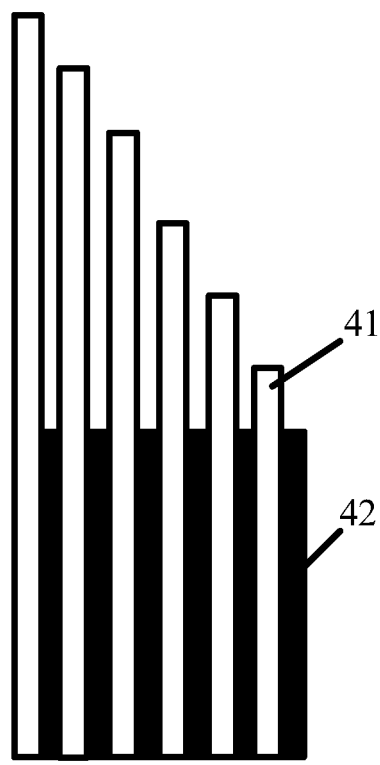
FIG. 3 is a schematic view illustrating the distribution of Al component content in an electron blocking layer in a second embodiment of the invention.

The semiconductor LED in Example 2 has the same structure as the abovementioned example. In this example, the distribution of Al component of the first AlGaN layers and the second AlGaN layers of the electron blocking layer is shown in FIG. 3. In FIG. 3, white boxes represent the first AlGaN layers, black boxes represent the second AlGaN layers, and the height of the boxes indicates the size of the content of the layer of Al components. A left side of the figure denotes the side of the quantum well layer, and a right side of the figure denotes the side of the p-GaN layer.

As shown in FIG. 3, in this example, from the side of the quantum well layer to the side of the p-GaN layer, namely from the left side to the right side, the Al component of the plurality of first AlGaN layers 41 is gradually decreased layer by layer, and the Al component of the plurality of second AlGaN layers 42 are invariable.

In this example, the electron blocking layer 40 may comprise, but not limited to, ten first AlGaN layers 41 and ten second AlGaN layers 42. Al component of the second AlGaN layer 42 is 0. Al component of the leftmost first AlGaN layer 41 is 0.3, Al component of the rightmost first AlGaN layer 41 is 0.1. From left to right, Al component of each first AlGaN layer 41 is decreased by an amount of 0.02. It can be envisaged that the Al component of each of the first AlGaN layer 41 is decreased by an unfixed amount.

The thickness of the electron blocking layer 40 is preferably 20-50 nm, and the thickness of each of the first AlGaN layers 41 and the second AlGaN layers 42 is preferably 1-3 nm.

In this example, the electron blocking layer 40 may have a thickness of 20 nm, and each of the first AlGaN layers 41 and the second AlGaN layers 42 may have a thickness of 1 nm.

It should be noted that the number of the first AlGaN layers and the number of the second AlGaN layers in the figure are only examples, but do not represent the actual number of them, which is used to illustrate the change rule of Al component of the first AlGaN layers and the second AlGaN layers. In this example, the number of the first AlGaN layers is the same number as that of the second AlGaN layers, but the number of the first AlGaN layers also can be different from that of the second AlGaN layers. In this example, the thickness of the first AlGaN layer is the same number as that of the second AlGaN layer, but the thickness of the first AlGaN layer also can be different from that of the second AlGaN layer. Moreover, the stacking order of the first AlGaN layers and the second AlGaN layers is not limited by the example. Additionally, Al component of all of the first AlGaN layers are higher than that of all of the second AlGaN layers, but in other examples, Al component of some of the first AlGaN layers are higher than that of the second AlGaN layers, while Al component of other first AlGaN layers are lower than that of the second AlGaN layers; or Al component of all of the first AlGaN layers are lower than that of all of the second AlGaN layers.

The examples of the present invention design and optimize the changes of the Al component of the electron blocking layer by energy band engineering, namely by arranging the first and second AlGaN layers which are alternately stacked and form a structure like a superlattice structure to generate a three-dimensional free hole gas in the p-GaN layer and, in turn, obtain a high hole concentration which can reach an order of $1*e^{18}$ cm$^{-3}$. Then the overflow of the electrons can be blocked, while hole injection efficiency can be improved, thereby improving the quantum efficiency of the LED.

Example 3

Figure 4:
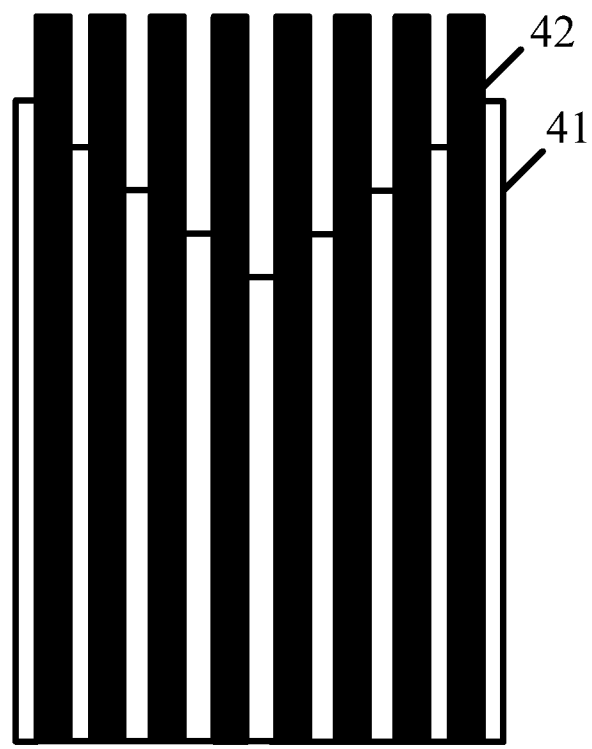
FIG. 4 is a schematic view illustrating the distribution of Al component content in an electron blocking layer in a third embodiment of the invention.

The semiconductor LED in Example 3 has the same structure as the abovementioned example. In this example, the distribution of Al component of the first AlGaN layers and the second AlGaN layers of the electron blocking layer is shown in FIG. 4. In FIG. 4, white boxes represent the first AlGaN layers, black boxes represent the second AlGaN layers, and the height of the boxes indicates the size of the content of the layer of Al components. A left side of the figure denotes the side of the quantum well layer, and a right side of the figure denotes the side of the p-GaN layer.

As shown in FIG. 4, in this example, the Al component of the plurality of second AlGaN layers are invariable, the first AlGaN layer with lowest Al component is located in the middle portion of the electron blocking layer, from the first AlGaN layer with lowest Al component to the side of the quantum well layer, namely from middle portion to the left side, the Al component of the first AlGaN layers 41 is gradually increased layer by layer; from the first AlGaN layer with lowest Al component to the side of the p-GaN layer, namely from middle portion to the right side, the Al component of the first AlGaN layers 41 is gradually increased layer by layer.

In this example, the electron blocking layer 40 may comprise, but not limited to, twenty-one first AlGaN layers 41 and twenty-one second AlGaN layers 42. Al component of the second AlGaN layer 42 is 0.3. As shown in FIG. 4, the first AlGaN layer with lowest Al component is located in the middle portion of the electron blocking layer 40, whose Al component is 0.1. Al component of the leftmost first AlGaN layer 41 is 0.21, Al component of the rightmost first AlGaN layer 41 is 0.21. From the middle portion to the left side of the figure, Al component of each first AlGaN layer 41 is increased by an amount of 0.01. From the middle portion to the right side of the figure, Al component of each first AlGaN layer 41 is increased by an amount of 0.01.

It should be noted that, in this example, Al component of the first AlGaN layers are increased by a fixed amount. It can be envisaged that the Al component of the first AlGaN layers 41 is increased by an unfixed amount. In addition, in this example, there is one first AlGaN layer with lowest Al component in all of the first AlGaN layers, but in another example, there is two first AlGaN layers with lowest Al component which are arranged symmetrically on both sides of one of the second AlGaN layers.

The thickness of the electron blocking layer 40 is preferably 20-50 nm, and the thickness of each of the first AlGaN layers 41 and the second AlGaN layers 42 is preferably 1-3 nm.

In this example, the electron blocking layer 40 may have a thickness of 41 nm, and each of the first AlGaN layers 41 and the second AlGaN layers 42 may have a thickness of 1 nm.

It should be noted that the number of the first AlGaN layers and the number of the second AlGaN layers in the figure are only examples, but do not represent the actual number of them, which is used to illustrate the change rule of Al component of the first AlGaN layers and the second AlGaN layers. In this example, the number of the first AlGaN layers is not equal to that of the second AlGaN layers, but the number of the first AlGaN layers also can be equal to that of the second AlGaN layers. In this case, the leftmost first AlGaN layer and rightmost first AlGaN layer have different Al component content. In this example, the thickness of the first AlGaN layer is the same number as that of the second AlGaN layer, but the thickness of the first AlGaN layer also can be different from that of the second AlGaN layer. Moreover, the stacking order of the first AlGaN layers and the second AlGaN layers is not limited by the example. Additionally, Al component of all of the first AlGaN layers are lower than that of all of the second AlGaN layers, but in other examples, Al component of some of the first AlGaN layers are higher than that of the second AlGaN layers, while Al component of other first AlGaN layers are lower than that of the second AlGaN layers; or Al component of all of the first AlGaN layers are higher than that of all of the second AlGaN layers.

The examples of the present invention design and optimize the changes of the Al component of the electron blocking layer by energy band engineering, namely by arranging the first and second AlGaN layers which are alternately stacked and form a structure like a superlattice structure to generate a three-dimensional free hole gas in the p-GaN layer and, in turn, obtain a high hole concentration which can reach an order of $1*e^{18}$ cm$^{-3}$. Then the overflow of the electrons can be blocked, while hole injection efficiency can be improved, thereby improving the quantum efficiency of the LED.

Example 4

Figure 5:
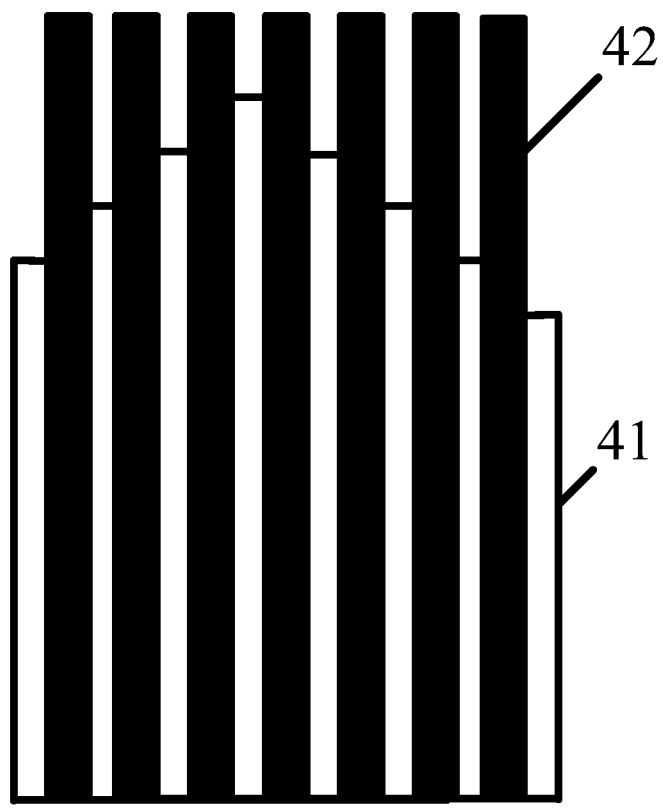
FIG. 5 is a schematic view illustrating the distribution of Al component content in an electron blocking layer in a fourth embodiment of the invention.

The semiconductor LED in Example 4 has the same structure as the abovementioned example. In this example, the distribution of Al component of the first AlGaN layers and the second AlGaN layers of the electron blocking layer is shown in FIG. 5. In FIG. 5, white boxes represent the first AlGaN layers, black boxes represent the second AlGaN layers, and the height of the boxes indicates the size of the content of the layer of Al components. A left side of the figure denotes the side of the quantum well layer, and a right side of the figure denotes the side of the p-GaN layer.

As shown in FIG. 5, in this example, the Al component of the plurality of second AlGaN layers 42 are invariable, the first AlGaN layer 41 with highest Al component is located in the middle portion of the electron blocking layer 40. From the first AlGaN layer with highest Al component to the side of the quantum well layer, namely from middle portion to the left side, the Al component of the first AlGaN layers 41 is gradually decreased layer by layer; from the first AlGaN layer with highest Al component to the side of the p-GaN layer, namely from middle portion to the right side, the Al component of the first AlGaN layers 41 is gradually decreased layer by layer.

In this example, the electron blocking layer 40 may comprise, but not limited to, twenty first AlGaN layers 41 and twenty second AlGaN layers 42. Al component of the second AlGaN layer 42 is 0.15. As shown in FIG. 5, the first AlGaN layer 41 with highest Al component is located in the middle portion of the electron blocking layer 40, whose Al component is 0.1. Al component of the leftmost first AlGaN layer 41 is 0.01, Al component of the rightmost first AlGaN layer 41 is 0. From the middle portion to the left side of the figure, Al component of each first AlGaN layer 41 is decreased by an amount of 0.01. From the middle portion to the right side of the figure, Al component of each first AlGaN layer 41 is decreased by an amount of 0.01.

It should be noted that, in this example, Al component of the first AlGaN layers 41 are decreased by a fixed amount. It can be envisaged that the Al component of the first AlGaN layers 41 is decreased by an unfixed amount. In addition, in this example, there is one first AlGaN layer with highest Al component in all of the first AlGaN layers, but in another example, there is two first AlGaN layers with highest Al component which are arranged symmetrically on both sides of one of the second AlGaN layers.

The thickness of the electron blocking layer 40 is preferably 20-50 nm, and the thickness of each of the first AlGaN layers 41 and the second AlGaN layers 42 is preferably 1-3 nm.

In this example, the electron blocking layer 40 may have a thickness of 39 nm, and each of the first AlGaN layers 41 and the second AlGaN layers 42 may have a thickness of 1 nm.

It should be noted that the number of the first AlGaN layers and the number of the second AlGaN layers in the figure are only examples, but do not represent the actual number of them, which is used to illustrate the change rule of Al component of the first AlGaN layers and the second AlGaN layers. In this example, the number of the first AlGaN layers is not equal to that of the second AlGaN layers, but the number of the first AlGaN layers also can be equal to that of the second AlGaN layers. In this case, the leftmost first AlGaN layer and rightmost first AlGaN layer have different Al component content. In this example, the thickness of the first AlGaN layer is the same number as that of the second AlGaN layer, but the thickness of the first AlGaN layer also can be different from that of the second AlGaN layer. Moreover, the stacking order of the first AlGaN layers and the second AlGaN layers is not limited by the example. Additionally, Al component of all of the first AlGaN layers are lower than that of all of the second AlGaN layers, but in other examples, Al component of some of the first AlGaN layers are higher than that of the second AlGaN layers, while Al component of other first AlGaN layers are lower than that of the second AlGaN layers; or Al component of all of the first AlGaN layers are higher than that of all of the second AlGaN layers.

The examples of the present invention design and optimize the changes of the Al component of the electron blocking layer by energy band engineering, namely by arranging the first and second AlGaN layers which are alternately stacked and form a structure like a superlattice structure to generate a three-dimensional free hole gas in the p-GaN layer and, in turn, obtain a high hole concentration which can reach an order of $1*e^{18}$ cm$^{-3}$. Then the overflow of the electrons can be blocked, while hole injection efficiency can be improved, thereby improving the quantum efficiency of the LED.

Example 5

Figure 6:
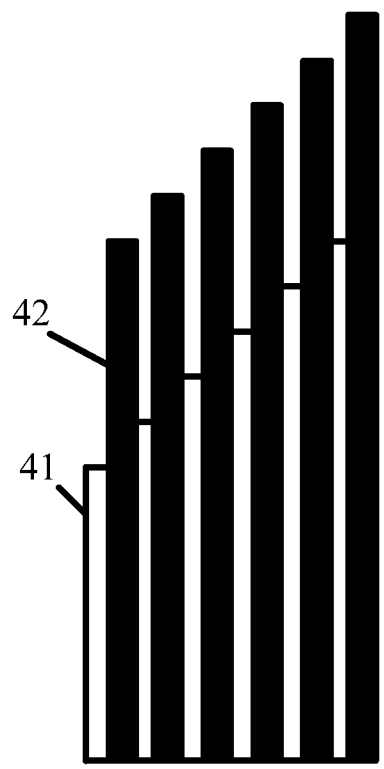
FIG. 6 is a schematic view illustrating the distribution of Al component content in an electron blocking layer in a fifth embodiment of the invention.

The semiconductor LED in Example 5 has the same structure as the abovementioned example. In this example, the distribution of Al component of the first AlGaN layers and the second AlGaN layers of the electron blocking layer is shown in FIG. 6. In FIG. 6, white boxes represent the first AlGaN layers, black boxes represent the second AlGaN layers, and the height of the boxes indicates the size of the content of the layer of Al components. A left side of the figure denotes the side of the quantum well layer, and a right side of the figure denotes the side of the p-GaN layer.

As shown in FIG. 6, in this example, from the side of the quantum well layer to the side of the p-GaN layer, namely from the left side to the right side, the Al component of the plurality of first AlGaN layers 41 is gradually increased layer by layer, and the Al component of the plurality of second AlGaN layers 42 are increased layer by layer, too.

In this example, the electron blocking layer 40 may comprise, but not limited to, twenty first AlGaN layers 41 and twenty second AlGaN layers 42. Al component of the leftmost first AlGaN layer 41 is 0, Al component of the rightmost first AlGaN layer 41 is 0.2. From left to right, Al component of each first AlGaN layer 41 is increased by an amount of 0.01. Al component of the leftmost second AlGaN layer 42 is 0.1, Al component of the rightmost second AlGaN layer 42 is 0.3. From left to right, Al component of each second AlGaN layer 42 is increased by an amount of 0.01. It can be envisaged that the Al component of each of the first AlGaN layer 41 and the second AlGaN layer 42 is increased by an unfixed amount.

The thickness of the electron blocking layer 40 is preferably 20-50 nm, and the thickness of each of the first AlGaN layers 41 and the second AlGaN layers 42 is preferably 1-3 nm.

In this example, the electron blocking layer 40 may have a thickness of 40 nm, and each of the first AlGaN layers 41 and the second AlGaN layers 42 may have a thickness of 1 nm.

It should be noted that the number of the first AlGaN layers and the number of the second AlGaN layers in the figure are only examples, but do not represent the actual number of them, which is used to illustrate the change rule of Al component of the first AlGaN layers and the second AlGaN layers. In this example, the number of the first AlGaN layers is the same number as that of the second AlGaN layers, but the number of the first AlGaN layers also can be different from that of the second AlGaN layers. In this example, the thickness of the first AlGaN layer is the same number as that of the second AlGaN layer, but the thickness of the first AlGaN layer also can be different from that of the second AlGaN layer. Moreover, the stacking order of the first AlGaN layers and the second AlGaN layers is not limited by the example. Additionally, Al component of all of the first AlGaN layers are lower than that of all of the second AlGaN layers in this example, but in other examples, Al component of some of the first AlGaN layers are higher than that of the second AlGaN layers, while Al component of other first AlGaN layers are lower than that of the second AlGaN layers; or Al component of all of the first AlGaN layers are higher than that of all of the second AlGaN layers.

The examples of the present invention design and optimize the changes of the Al component of the electron blocking layer by energy band engineering, namely by arranging the first and second AlGaN layers which are alternately stacked and form a structure like a superlattice structure to generate a three-dimensional free hole gas in the p-GaN layer and, in turn, obtain a high hole concentration which can reach an order of $1*e^{18}$ cm$^{-3}$. Then the overflow of the electrons can be blocked, while hole injection efficiency can be improved, thereby improving the quantum efficiency of the LED.

Example 6

Figure 7:
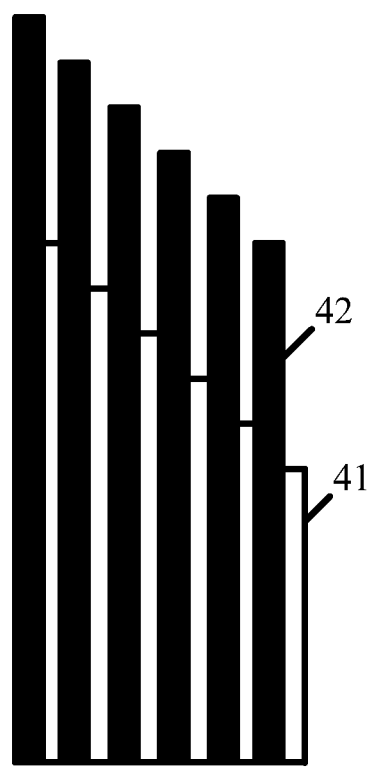
FIG. 7 is a schematic view illustrating the distribution of Al component content in an electron blocking layer in a sixth embodiment of the invention.

The semiconductor LED in Example 6 has the same structure as the abovementioned example. In this example, the distribution of Al component of the first AlGaN layers and the second AlGaN layers of the electron blocking layer is shown in FIG. 7. In FIG. 7, white boxes represent the first AlGaN layers, black boxes represent the second AlGaN layers, and the height of the boxes indicates the size of the content of the layer of Al components. A left side of the figure denotes the side of the quantum well layer, and a right side of the figure denotes the side of the p-GaN layer.

As shown in FIG. 7, in this example, from the side of the quantum well layer to the side of the p-GaN layer, namely from the left side to the right side, the Al component of the plurality of first AlGaN layers 41 is gradually decreased layer by layer, and the Al component of the plurality of second AlGaN layers 42 are decreased layer by layer, too.

In this example, the electron blocking layer 40 may comprise, but not limited to, twenty first AlGaN layers 41 and twenty second AlGaN layers 42. Al component of the leftmost first AlGaN layer 41 is 0.2, Al component of the rightmost first AlGaN layer 41 is 0. From left to right, Al component of each first AlGaN layer 41 is decreased by an amount of 0.01. Al component of the leftmost second AlGaN layer 42 is 0.3, Al component of the rightmost second AlGaN layer 42 is 0.1. From left to right, Al component of each second AlGaN layer 42 is decreased by an amount of 0.01. It can be envisaged that the Al component of each of the first AlGaN layer 41 and the second AlGaN layer 42 is decreased by an unfixed amount.

The thickness of the electron blocking layer 40 is preferably 20-50 nm, and the thickness of each of the first AlGaN layers 41 and the second AlGaN layers 42 is preferably 1-3 nm.

In this example, the electron blocking layer 40 may have a thickness of 40 nm, and each of the first AlGaN layers 41 and the second AlGaN layers 42 may have a thickness of 1 nm.

It should be noted that the number of the first AlGaN layers and the number of the second AlGaN layers in the figure are only examples, but do not represent the actual number of them, which is used to illustrate the change rule of Al component of the first AlGaN layers and the second AlGaN layers. In this example, the number of the first AlGaN layers is the same number as that of the second AlGaN layers, but the number of the first AlGaN layers also can be different from that of the second AlGaN layers. In this example, the thickness of the first AlGaN layer is the same number as that of the second AlGaN layer, but the thickness of the first AlGaN layer also can be different from that of the second AlGaN layer. Moreover, the stacking order of the first AlGaN layers and the second AlGaN layers is not limited by the example. Additionally, Al component of all of the first AlGaN layers are lower than that of all of the second AlGaN layers in this example, but in other examples, Al component of some of the first AlGaN layers are higher than that of the second AlGaN layers, while Al component of other first AlGaN layers are lower than that of the second AlGaN layers; or Al component of all of the first AlGaN layers are higher than that of all of the second AlGaN layers.

The examples of the present invention design and optimize the changes of the Al component of the electron blocking layer by energy band engineering, namely by arranging the first and second AlGaN layers which are alternately stacked and form a structure like a superlattice structure to generate a three-dimensional free hole gas in the p-GaN layer and, in turn, obtain a high hole concentration which can reach an order of $1*e^{18}$ cm$^{-3}$. Then the overflow of the electrons can be blocked, while hole injection efficiency can be improved, thereby improving the quantum efficiency of the LED.

Example 7

Figure 8:
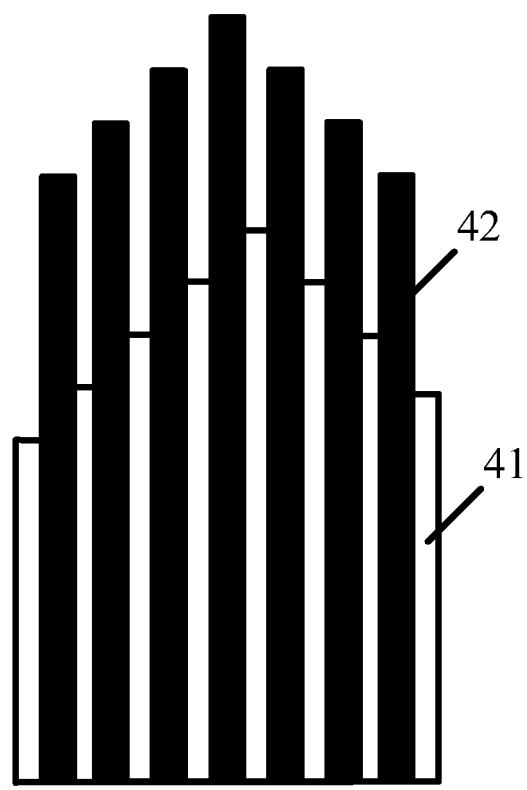
FIG. 8 is a schematic view illustrating the distribution of Al component content in an electron blocking layer in a seventh embodiment of the invention.

The semiconductor LED in Example 7 has the same structure as the abovementioned example. In this example, the distribution of Al component of the first AlGaN layers and the second AlGaN layers of the electron blocking layer is shown in FIG. 8. In FIG. 8, white boxes represent the first AlGaN layers, black boxes represent the second AlGaN layers, and the height of the boxes indicates the size of the content of the layer of Al components. A left side of the figure denotes the side of the quantum well layer, and a right side of the figure denotes the side of the p-GaN layer.

As shown in FIG. 8, in this example, the first AlGaN layer 41 with highest Al component is located in the middle portion of the electron blocking layer 40. From the first AlGaN layer with highest Al component to the side of the quantum well layer, namely from middle portion to the left side, the Al component of the first AlGaN layers 41 is gradually decreased layer by layer; from the first AlGaN layer with highest Al component to the side of the p-GaN layer, namely from middle portion to the right side, the Al component of the first AlGaN layers 41 is gradually decreased layer by layer. The second AlGaN layer 42 with highest Al component is located in the middle portion of the electron blocking layer 40. From the second AlGaN layer 42 with highest Al component to the side of the quantum well layer, namely from middle portion to the left side, the Al component of the second AlGaN layers 42 is gradually decreased layer by layer; from the second AlGaN layer 42 with highest Al component to the side of the p-GaN layer, namely from middle portion to the right side, the Al component of the second AlGaN layers 42 is gradually decreased layer by layer.

In this example, the electron blocking layer 40 may comprise, but not limited to, twenty first AlGaN layers 41 and twenty second AlGaN layers 42. As shown in FIG. 8, the first AlGaN layer 41 with highest Al component is located in the middle portion of the electron blocking layer 40, whose Al component is 0.1. Al component of the leftmost first AlGaN layer 41 is 0.01, Al component of the rightmost first AlGaN layer 41 is 0. From the middle portion to the left side of the figure, Al component of each first AlGaN layer 41 is decreased by an amount of 0.01. From the middle portion to the right side of the figure, Al component of each first AlGaN layer 41 is decreased by an amount of 0.01. The second AlGaN layer 42 with highest Al component is located in the middle portion of the electron blocking layer 40, whose Al component is 0.2. Al component of the leftmost second AlGaN layer 42 is 0.11, Al component of the rightmost second AlGaN layer 42 is 0.1. From the middle portion to the left side of the figure, Al component of each second AlGaN layer 42 is decreased by an amount of 0.01. From the middle portion to the right side of the figure, Al component of each second AlGaN layer 42 is decreased by an amount of 0.01.

It should be noted that, in this example, Al component of the first AlGaN layers 41 and the second AlGaN layers 42 are decreased by a fixed amount. It can be envisaged that the Al component of the first AlGaN layers 41 and the second AlGaN layers 42 is decreased by an unfixed amount.

The thickness of the electron blocking layer 40 is preferably 20-50 nm, and the thickness of each of the first AlGaN layers 41 and the second AlGaN layers 42 is preferably 1-3 nm.

In this example, the electron blocking layer 40 may have a thickness of 40 nm, and each of the first AlGaN layers 41 and the second AlGaN layers 42 may have a thickness of 1 nm.

It should be noted that the number of the first AlGaN layers and the number of the second AlGaN layers in the figure are only examples, but do not represent the actual number of them, which is used to illustrate the change rule of Al component of the first AlGaN layers and the second AlGaN layers. In this example, the number of the first AlGaN layers is not equal to that of the second AlGaN layers, but the number of the first AlGaN layers also can be equal to that of the second AlGaN layers. In this case, the leftmost first AlGaN layer and rightmost first AlGaN layer have different Al component content. In this example, the thickness of the first AlGaN layer is the same number as that of the second AlGaN layer, but the thickness of the first AlGaN layer also can be different from that of the second AlGaN layer. Moreover, the stacking order of the first AlGaN layers and the second AlGaN layers is not limited by the example. Additionally, Al component of all of the first AlGaN layers are lower than that of all of the second AlGaN layers, but in other examples, Al component of some of the first AlGaN layers are higher than that of the second AlGaN layers, while Al component of other first AlGaN layers are lower than that of the second AlGaN layers; or Al component of all of the first AlGaN layers are higher than that of all of the second AlGaN layers.

The examples of the present invention design and optimize the changes of the Al component of the electron blocking layer by energy band engineering, namely by arranging the first and second AlGaN layers which are alternately stacked and form a structure like a superlattice structure to generate a three-dimensional free hole gas in the p-GaN layer and, in turn, obtain a high hole concentration which can reach an order of $1*e^{18}$ cm$^{-3}$. Then the overflow of the electrons can be blocked, while hole injection efficiency can be improved, thereby improving the quantum efficiency of the LED.

Example 8

Figure 9:
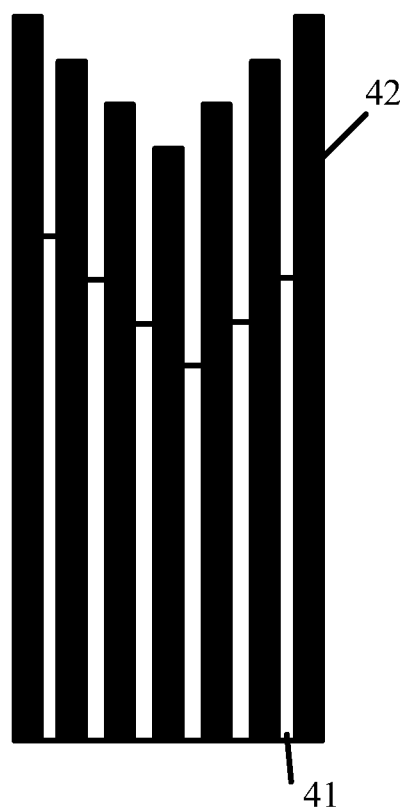
FIG. 9 is a schematic view illustrating the distribution of Al component content in an electron blocking layer in an eighth embodiment of the invention.

The semiconductor LED in Example 8 has the same structure as the abovementioned example. In this example, the distribution of Al component of the first AlGaN layers and the second AlGaN layers of the electron blocking layer is shown in FIG. 9. In FIG. 9, white boxes represent the first AlGaN layers, black boxes represent the second AlGaN layers, and the height of the boxes indicates the size of the content of the layer of Al components. A left side of the figure denotes the side of the quantum well layer, and a right side of the figure denotes the side of the p-GaN layer.

As shown in FIG. 9, in this example, the first AlGaN layer 41 with lowest Al component is located in the middle portion of the electron blocking layer 40. From the first AlGaN layer 41 with lowest Al component to the side of the quantum well layer, namely from middle portion to the left side, the Al component of the first AlGaN layers 41 is gradually increased layer by layer; from the first AlGaN layer with lowest Al component to the side of the p-GaN layer, namely from middle portion to the right side, the Al component of the first AlGaN layers 41 is gradually increased layer by layer. The second AlGaN layer 42 with lowest Al component is located in the middle portion of the electron blocking layer 40. From the second AlGaN layer 42 with lowest Al component to the side of the quantum well layer, namely from middle portion to the left side, the Al component of the second AlGaN layers 42 is gradually increased layer by layer; from the second AlGaN layer 42 with lowest Al component to the side of the p-GaN layer, namely from middle portion to the right side, the Al component of the second AlGaN layers 42 is gradually increased layer by layer.

In this example, the electron blocking layer 40 may comprise, but not limited to, twenty-one first AlGaN layers 41 and twenty-one second AlGaN layers 42. As shown in FIG. 9, the first AlGaN layer 41 with lowest Al component is located in the middle portion of the electron blocking layer 40, whose Al component is 0.1. Al component of the leftmost first AlGaN layer 41 is 0.2, Al component of the rightmost first AlGaN layer 41 is 0.19. From the middle portion to the left side of the figure, Al component of each first AlGaN layer 41 is increased by an amount of 0.01. From the middle portion to the right side of the figure, Al component of each first AlGaN layer 41 is increased by an amount of 0.01.

The second AlGaN layer 42 with lowest Al component is located in the middle portion of the electron blocking layer 40, whose Al component is 0.2. Al component of the leftmost second AlGaN layer 42 is 0.3, Al component of the rightmost second AlGaN layer 42 is 0.29. From the middle portion to the left side of the figure, Al component of each second AlGaN layer 42 is increased by an amount of 0.01. From the middle portion to the right side of the figure, Al component of each second AlGaN layer 42 is increased by an amount of 0.01.

It should be noted that, in this example, Al component of the first AlGaN layers 41 and the second AlGaN layers 42 are increased by a fixed amount. It can be envisaged that the Al component of the first AlGaN layers 41 and the second AlGaN layers 42 is increased by an unfixed amount.

The thickness of the electron blocking layer 40 is preferably 20-50 nm, and the thickness of each of the first AlGaN layers 41 and the second AlGaN layers 42 is preferably 1-3 nm.

In this example, the electron blocking layer 40 may have a thickness of 40 nm, and each of the first AlGaN layers 41 and the second AlGaN layers 42 may have a thickness of 1 nm.

It should be noted that the number of the first AlGaN layers and the number of the second AlGaN layers in the figure are only examples, but do not represent the actual number of them, which is used to illustrate the change rule of Al component of the first AlGaN layers and the second AlGaN layers. In this example, the number of the first AlGaN layers is not equal to that of the second AlGaN layers, but the number of the first AlGaN layers also can be equal to that of the second AlGaN layers. In this case, the leftmost first AlGaN layer and rightmost first AlGaN layer have different Al component content. In this example, the thickness of the first AlGaN layer is the same number as that of the second AlGaN layer, but the thickness of the first AlGaN layer also can be different from that of the second AlGaN layer. Moreover, the stacking order of the first AlGaN layers and the second AlGaN layers is not limited by the example. Additionally, Al component of all of the first AlGaN layers are lower than that of all of the second AlGaN layers, but in other examples, Al component of some of the first AlGaN layers are higher than that of the second AlGaN layers, while Al component of other first AlGaN layers are lower than that of the second AlGaN layers; or Al component of all of the first AlGaN layers are higher than that of all of the second AlGaN layers.

The examples of the present invention design and optimize the changes of the Al component of the electron blocking layer by energy band engineering, namely by arranging the first and second AlGaN layers which are alternately stacked and form a structure like a superlattice structure to generate a three-dimensional free hole gas in the p-GaN layer and, in turn, obtain a high hole concentration which can reach an order of $1*e^{18}$ cm$^{-3}$. Then the overflow of the electrons can be blocked, while hole injection efficiency can be improved, thereby improving the quantum efficiency of the LED.

The electron blocking layer according to the examples of the invention is particularly applicable to the blue and green light emitting diodes.

Example 9

Figure 10:
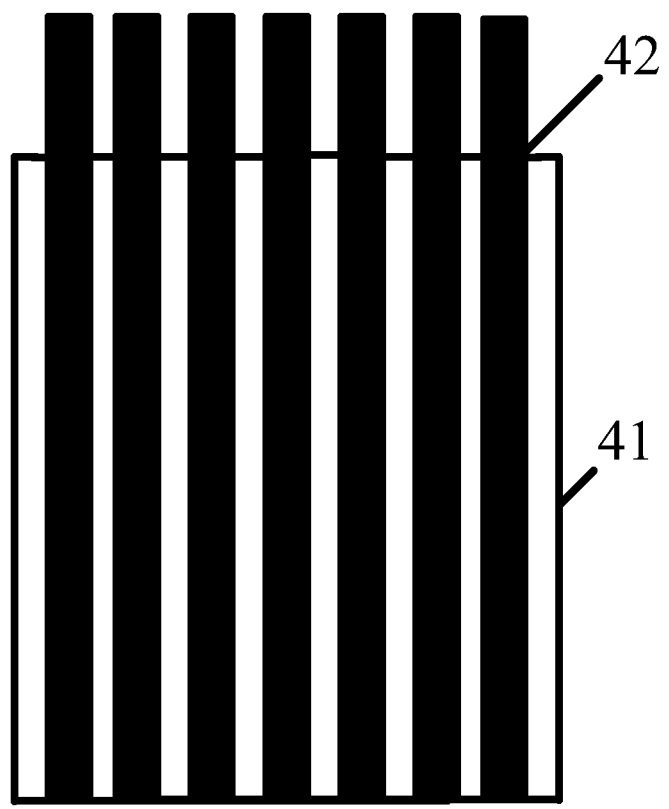
FIG. 10 is a schematic view illustrating the distribution of Al component content in an electron blocking layer in a ninth embodiment of the invention.

The semiconductor LED in Example 9 has the same structure as the abovementioned example. In this example, the distribution of Al component of the first AlGaN layers and the second AlGaN layers of the electron blocking layer is shown in FIG. 10. In FIG. 10, white boxes represent the first AlGaN layers, black boxes represent the second AlGaN layers, and the height of the boxes indicates the size of the content of the layer of Al components. A left side of the figure denotes the side of the quantum well layer, and a right side of the figure denotes the side of the p-GaN layer.

As shown in FIG. 10, in this example, the Al component of the plurality of first AlGaN layers 41 is invariable, and the Al component of the plurality of second AlGaN layers 42 is invariable. In this example, the electron blocking layer comprises a plurality of first AlGaN layers 41 and a plurality of second AlGaN layers 42, but in another example, the electron blocking layer may comprise one first AlGaN layer 41 and one second AlGaN layer 42.

The thickness of the electron blocking layer 40 is preferably 20-50 nm, and the thickness of each of the first AlGaN layers 41 and the second AlGaN layers 42 is preferably 1-3 nm.

In this example, the electron blocking layer 40 may have a thickness of 30 nm, and each of the first AlGaN layers 41 and the second AlGaN layers 42 may have a thickness of 1.5 nm.

It should be noted that the number of the first AlGaN layers and the number of the second AlGaN layers in the figure are only examples, but do not represent the actual number of them, which is used to illustrate the change rule of Al component of the first AlGaN layers and the second AlGaN layers. In this example, the number of the first AlGaN layers is the same number as that of the second AlGaN layers, but the number of the first AlGaN layers also can be different from that of the second AlGaN layers. In this example, the thickness of the first AlGaN layer is the same number as that of the second AlGaN layer, but the thickness of the first AlGaN layer also can be different from that of the second AlGaN layer. Moreover, the stacking order of the first AlGaN layers and the second AlGaN layers is not limited by the example. Additionally, Al component of all of the first AlGaN layers are lower than that of all of the second AlGaN layers, but in other examples, Al component of some of the first AlGaN layers are higher than that of the second AlGaN layers, while Al component of other first AlGaN layers are lower than that of the second AlGaN layers; or Al component of all of the first AlGaN layers are higher than that of all of the second AlGaN layers.

Example 10

The example provides a method for manufacturing the above-mentioned semiconductor LED, which comprises sequentially growing an n-GaN layer, a quantum well layer, an electron blocking layer and a p-GaN layer on a substrate.

Specifically, the layer structure can be manufactured by metal organic chemical vapor deposition epitaxy skill.

More specifically, the method may comprise the following steps:

Step 1: growing an n-GaN layer on a substrate which is doped with Si. The doping concentration is in an order of $e^{18}$-$e^{19}$ cm$^{-3}$. The growth temperature of the n-GaN layer is 1000-1100° C., the growth pressure of the n-GaN layer is 100-500 Torr, and the thickness of the n-GaN layer is about 2500 nm.

Preferably, before Step 1, a buffer layer is grown on the substrate. Its growth temperature is 500-600° C. Its growth pressure is 300-700 Torr. And the thickness of the buffer layer is 50-100 nm.

More preferably, after the growth of the buffer layer, an intrinsic GaN layer is grown on the buffer layer. The growth temperature of the intrinsic GaN layer is 1000-1100° C., the growth pressure of the intrinsic GaN layer is 100-500 Torr, and the thickness of the intrinsic GaN layer is about 300-5000 nm.

Step 2: growing a quantum well layer on the N-GaN layer, which are made of GaN layers and InGaN layers. The growth temperature of the GaN layer is 800-900° C., and the growth temperature of the InGaN layer is 750° C. The growth pressure of the GaN layer and the InGaN layer is 100-700 Torr. The thickness of the GaN layer is 8-30 nm, and the thickness of the InGaN layer is 2-4 nm.

Step 3: growing an electron blocking layer whose Al component is changed according to the aforementioned examples on the quantum well layer. The growth temperature of the electron blocking layer is 800-1000° C., and the growth pressure of the electron blocking layer is 100-500 Torr.

Step 4: growing a p-GaN layer doping with Mg with a doping concentration of an order of $e^{18}$-$e^{19}$ cm$^{-3}$. The thickness of the p-GaN layer is about 150 nm.

After Step 4, the method may further comprises growing a p-GaN clad layer doping with Mg with a doping concentration of an order of $e^{19}$-$e^{21}$ cm$^{-3}$, and the thickness of the p-GaN clad layer is about 20 nm.

The examples of the present invention design and optimize the changes of the Al component of the electron blocking layer by energy band engineering, namely by arranging the first and second AlGaN layers which are alternately stacked and form a structure like a superlattice structure to generate a three-dimensional free hole gas in the p-GaN layer and, in turn, obtain a high hole concentration which can reach an order of 1*$e^{18}$ cm$^{-3}$. Then the overflow of the electrons can be blocked, while hole injection efficiency can be improved, thereby improving the quantum efficiency of the LED.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A semiconductor light-emitting diode, comprising:
   a substrate;
   an n-GaN layer;
   a quantum well layer;
   an electron blocking layer having a plurality of first AlGaN layers and a plurality of second AlGaN layers; and
   a p-GaN layer;
   wherein:
   the n-GaN layer, the quantum well layer, the electron blocking layer, and the p-GaN layer are sequentially stacked on the substrate;
   the first AlGaN layers and the second AlGaN layers are alternately stacked;

the adjacent two layers of the first AlGaN layers and the second AlGaN layers have different composition ratios of Al;

the composition ratios of Al in the first AlGaN layers gradually change with increasing distance from the quantum well layer;

the composition ratios of Al in the second AlGaN layers are the same; and the composition ratios of Al in the first AlGaN layers first decrease and then increase with increasing distance from the quantum well layer, or the composition ratios of Al in the first AlGaN layers first increase and then decrease with increasing distance from the quantum well layer.

2. A semiconductor light-emitting diode, comprising:
a substrate;
an n-GaN layer;
a quantum well layer;
an electron blocking layer having a plurality of first AlGaN layers and a plurality of second AlGaN layers; and
a p-GaN layer;
wherein:
the n-GaN layer, the quantum well layer, the electron blocking layer, and the p-GaN layer are sequentially stacked on the substrate;

the first AlGaN layers and the second AlGaN layers are alternately stacked;

the adjacent two layers of the first AlGaN layers and the second AlGaN layers have different composition ratios of Al;

the composition ratios of Al in the first AlGaN layers gradually change with increasing distance from the quantum well layer;

the composition ratios of Al in the second AlGaN layers gradually change with increasing distance from the quantum well layer; and the composition ratios of Al in the first AlGaN layers have the same changing trend as the composition ratios of Al in the second AlGaN layers; and the composition ratios of Al in the first AlGaN layers first decrease and then increase with increasing distance from the quantum well layer, and the composition ratios of Al in the second AlGaN layers first decrease and then increase with increasing distance from the quantum well layer; or the composition ratios of Al in the first AlGaN layers first increase and then decrease with increasing distance from the quantum well layer, and the composition ratios of Al in the second AlGaN layers first increase and then decrease with increasing distance from the quantum well layer.

3. The semiconductor light-emitting diode of claim 1, wherein the first AlGaN layers and the second AlGaN layers have a total number of between 2 and 40.

4. The semiconductor light-emitting diode of claim 1, wherein a difference between the composition ratios of Al in the adjacent two layers of the first AlGaN layers and the second AlGaN layers is between 0.05 and 0.15.

5. The semiconductor light-emitting diode of claim 1, wherein a thickness of the electron blocking layer is between 20 and 50 nm, a thickness of each of the first AlGaN layer is between 1 and 3 nm, and a thickness of each of the second AlGaN layer is between 1 and 3 nm.

6. The semiconductor light-emitting diode of claim 1, wherein the highest composition ratio of Al in the first AlGaN layers and the highest composition ratio of Al in the second AlGaN layers are between 0.15 and 0.5, respectively.

7. A method for manufacturing a semiconductor light-emitting diode of claim 1, the method comprising providing the substrate, and sequentially growing the n-GaN layer, the quantum well layer, the electron blocking layer, and the p-GaN layer on the substrate.

8. The semiconductor light-emitting diode of claim 2, wherein the first AlGaN layers and the second AlGaN layers have a total number of between 2 and 40.

9. The semiconductor light-emitting diode of claim 2, wherein a difference between the composition ratios of Al in the adjacent two layers of the first AlGaN layers and the second AlGaN layers is between 0.05 and 0.15.

10. The semiconductor light-emitting diode of claim 2, wherein a thickness of the electron blocking layer is between 20 and 50 nm, a thickness of each of the first AlGaN layers is between 1 and 3 nm, and a thickness of each of the second AlGaN layers is between 1 and 3 nm.

11. The semiconductor light-emitting diode of claim 2, wherein the highest composition ratio of Al in the first AlGaN layers and the highest composition ratio of Al in the second AlGaN layers are between 0.15 and 0.5, respectively.

12. A method for manufacturing a semiconductor light-emitting diode of claim 2, the method comprising providing the substrate, and sequentially growing the n-GaN layer, the quantum well layer, the electron blocking layer, and the p-GaN layer on the substrate.

* * * * *